US012677398B2

(12) United States Patent
Tunks et al.

(10) Patent No.: US 12,677,398 B2
(45) Date of Patent: Jul. 7, 2026

(54) SYSTEM AND METHOD FOR THERMAL MANAGEMENT OF HARDWARE COMPONENTS

(71) Applicant: Dell Products L.P., Round Rock, TX (US)

(72) Inventors: Eric Michael Tunks, Austin, TX (US); Julian Yu-Hao Chen, Austin, TX (US); Michael Albert Perks, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 931 days.

(21) Appl. No.: 18/048,151

(22) Filed: Oct. 20, 2022

(65) Prior Publication Data

US 2024/0138117 A1     Apr. 25, 2024
US 2024/0237294 A9     Jul. 11, 2024

(51) Int. Cl.
 H05K 7/20          (2006.01)
 G06F 1/20          (2006.01)
(52) U.S. Cl.
 CPC ......... H05K 7/20509 (2013.01); G06F 1/206 (2013.01); H05K 7/20154 (2013.01); H05K 7/20336 (2013.01)
(58) Field of Classification Search
 CPC ........... H05K 7/20509; H05K 7/20154; H05K 7/20336; G06F 1/206
 See application file for complete search history.

(56) References Cited

U.S. PATENT DOCUMENTS

| | | | |
|---|---|---|---|
| 5,602,721 A | 2/1997 | Slade et al. | |
| 5,761,033 A | 6/1998 | Wilhelm | |
| 6,798,659 B2 * | 9/2004 | Chen ........................ | H01L 23/38 |
| | | | 361/704 |
| 7,698,095 B2 | 4/2010 | Chung et al. | |
| 7,701,713 B2 | 4/2010 | Li | |
| 8,182,319 B2 | 5/2012 | Ong et al. | |
| 8,550,702 B2 | 10/2013 | Campbell et al. | |
| 9,129,958 B2 | 9/2015 | Mallik et al. | |
| 9,237,671 B2 | 1/2016 | Chen et al. | |
| 9,820,411 B2 | 11/2017 | Alshinnawi et al. | |
| 10,123,452 B2 | 11/2018 | Chen et al. | |
| 10,177,107 B2 | 1/2019 | Camarota | |
| 10,274,945 B2 | 4/2019 | Arensmeier et al. | |
| 10,709,032 B1 | 7/2020 | Holyoake et al. | |
| 11,019,748 B2 | 5/2021 | Avvaru et al. | |
| 11,064,808 B2 | 7/2021 | Chen et al. | |
| 11,129,293 B2 | 9/2021 | Wurmfeld | |
| 11,262,809 B2 | 3/2022 | Pham et al. | |
| 11,293,659 B2 | 4/2022 | Brahme et al. | |

(Continued)

*Primary Examiner* — Robert G Bachner
(74) *Attorney, Agent, or Firm* — WOMBLE BOND DICKINSON (US) LLP

(57) ABSTRACT

Methods, systems, and devices for providing computer implemented services are disclosed. To provide the computer implemented services, a data processing system may include hardware components that provide the computer implemented services. Any of the hardware components may have a limited thermal operating range. To retain the temperatures of hardware components within their operating ranges, the data processing system may include heat sinks fitted to the hardware components that are both able to cool and warm the fitted hardware components.

20 Claims, 7 Drawing Sheets

(56) References Cited

U.S. PATENT DOCUMENTS

| | | | |
|---|---|---|---|
| 11,320,164 B2 | 5/2022 | Roth | |
| 2001/0040203 A1 | 11/2001 | Brock et al. | |
| 2011/0100668 A1 | 5/2011 | Syed | |
| 2011/0228473 A1 | 9/2011 | Anderson et al. | |
| 2012/0229971 A1 | 9/2012 | Mills et al. | |
| 2013/0118718 A1* | 5/2013 | Chang | F28D 15/0275 |
| | | | 165/104.26 |
| 2014/0334084 A1 | 11/2014 | Fricker | |
| 2015/0177750 A1 | 6/2015 | Bailey et al. | |
| 2015/0180234 A1 | 6/2015 | Bailey et al. | |
| 2015/0289405 A1 | 10/2015 | Stewart et al. | |
| 2015/0359146 A1 | 12/2015 | Bailey et al. | |
| 2016/0044819 A1 | 2/2016 | Bailey et al. | |
| 2017/0177007 A1 | 6/2017 | Shelnutt et al. | |
| 2017/0181329 A1 | 6/2017 | Shelnutt et al. | |
| 2018/0011522 A1 | 1/2018 | Shirakami et al. | |
| 2022/0104380 A1 | 3/2022 | Hattangadi et al. | |
| 2022/0200250 A1 | 6/2022 | Brooks et al. | |

* cited by examiner

SYSTEM AND METHOD FOR THERMAL MANAGEMENT OF HARDWARE COMPONENTS

FIELD OF THE EMBODIMENTS

Embodiments disclosed herein relate generally to device management. More particularly, embodiments disclosed herein relate to systems and methods for retaining temperatures of components within thermal operating ranges.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
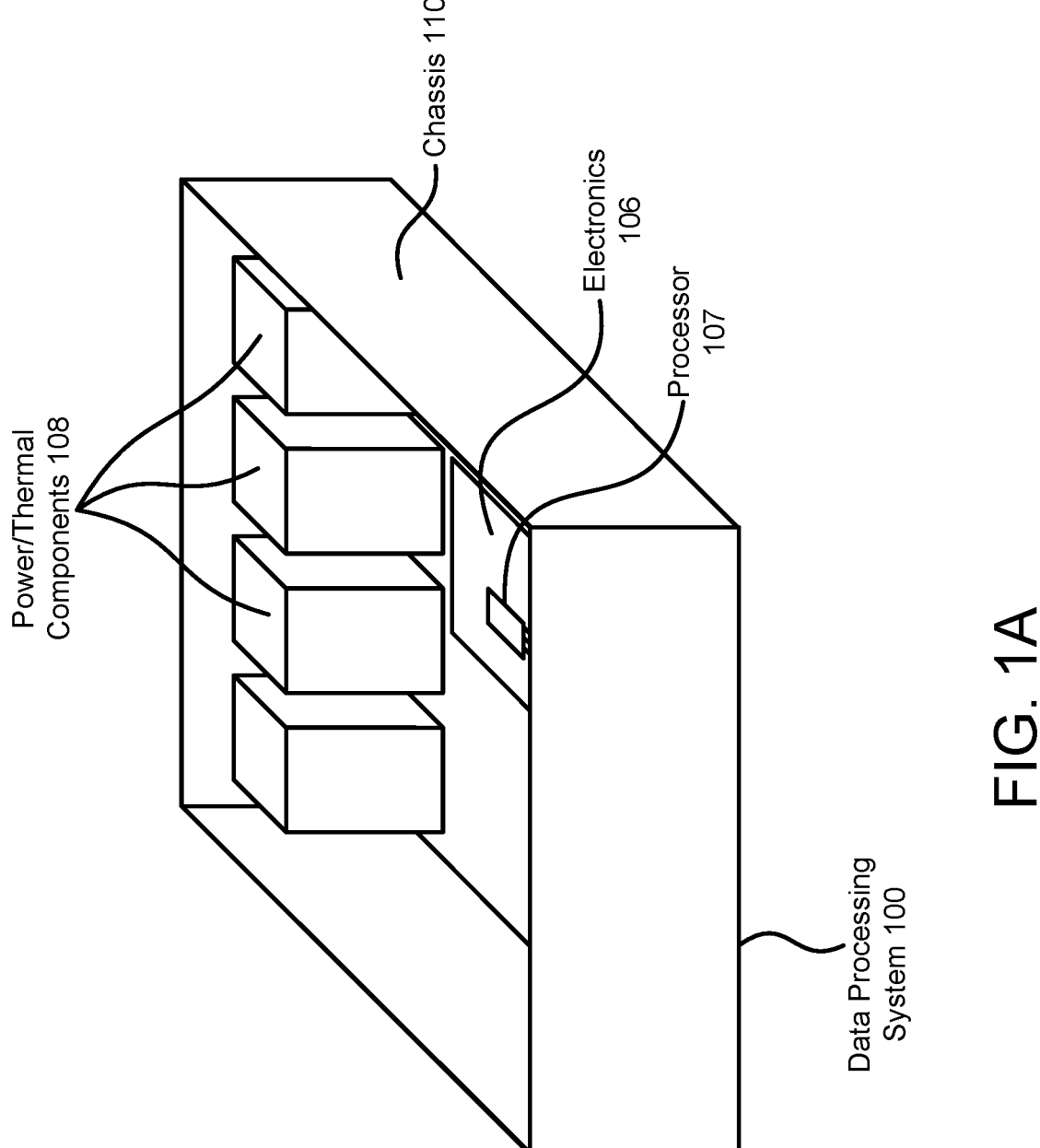
FIG. 1A shows a diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices. In the context of mechanical device, "adapted to" may mean that the mechanical device is designed to perform a particular function and may include a shape, size, structure, components thereof, etc. to accomplish the function.

In general, embodiments disclosed herein relate to methods, systems, and devices for providing computer implemented services. The computer implemented services may include any quantity and type of such services.

To provide the computer implemented services, a data processing system may be utilized. The data processing system may include hardware components that provide the computer implemented services.

Any of the hardware components may have a limited thermal operating range. To improve the likelihood of being able to provide the computer implemented services, the data processing system may include heat sinks that may be used to cool and warm the hardware components to retain their temperatures within corresponding thermal operating ranges.

To provide for both heating and cooling, the heat sinks may include heating assembly that are positioned to facilitate warming of a hardware component. The heating assembly may be positioned on an interconnected surface formed by plates and edge connectors of the heat sinks.

By positioning the heating assemblies on the interconnected surface of the heat sink, thermal conduction between the heating assembly and a hardware component may be improved. Consequently, the heating assembly may be more likely to successfully warm the hardware component to retain its temperature within its thermal operating range.

By doing so, embodiments disclosed herein may provide a data processing system capable of operating under a wider array of environment conditions by mitigating (e.g., reducing, limiting, etc.) the impact of environmental conditions in which the data processing system resides. Thus, embodiments disclosed herein may address the technical problem of operating condition limitations (e.g., thermal, and in particular cold weather) of data processing systems and hardware components thereof. The disclosed embodiments may address this problem by providing a data processing system having heat sinks with active heating capabilities (e.g., usable to warm hardware components to which the heat sinks are fitted) to mitigate the impact of cooler ambient temperatures on the hardware components the data processing systems.

In an embodiment, a data processing system is provided. The data processing system may include a hardware component; a fan adapted to generate a flow of gas to cool the hardware component; and a heatsink positioned with the hardware component, the heatsink comprising: a base adapted to establish a thermal condition path with the hardware component; plates, in thermal communication with the base, adapted to exchange heat with the flow of the gas to cool the hardware component; an edge connector that bridges a gap between a first edge of a first plate of the plate and a second edge of a second plate of the plates, the edge connector defining a portion of an interconnected surface that interconnects a portion of the plates; and a heating assembly positioned on the interconnected surface and adapted to selectively warm the hardware component substantially through conduction heating via the base, the plates, and the edge connector.

The heat sink may also include a heat pipe that places the base in thermal communication with the plates. The plates may be arranged in stack and the plates do not directly contact the base.

The heat sink may also include edge connectors comprising the edge connector. The edge connectors may be positioned to maintain predetermined distances between edges of the plates.

The edge connectors may be positioned to maintain the predetermine distances on two sides of the plates.

The edge connectors may also define a portion of a second interconnected surface that interconnects the portion of the plates, the interconnected surface being on a first of the two sides of the plates and the second interconnected surface being on a second side of the two sides of the plates.

The heatsink may also include a second heating assembly positioned on the second interconnected surface and adapted to selectively warm the hardware component substantially through conduction heating via the base, the plates, and the edge connector.

The heat sink may also include gas flow channels through which gases may flow to cool the plates, the gas flow channels being delimited on four sides by the plates and the edge connectors.

Lengths of the gas flow channels may be aligned with a direction of the flow of gas generated by the fan.

The edge connectors may be positioned to maintain the predetermine distances on a first side of the plates.

A second side of each of the plates may be directly connected to the base.

In an embodiment, a heat sink as discussed above is provided.

Turning to FIG. 1A, a diagram illustrating a system in accordance with an embodiment is shown. The system may provide computer implemented services. To provide the computer implemented services, the system may include data processing system 100.

Data processing system 100 may include functionality to provide various types of computer implemented services. The computer implemented services may include any number and type of computer implemented services. The computer implemented services may include, for example, database services, data processing services, electronic communication services, and/or any other services that may be provided using one or more computing devices. Other types of computer implemented services may be provided by data processing system 100 without departing from embodiments disclosed herein.

To provide the computer implemented services, data processing system 100 may include various components such as electronics 106 and power/thermal components 108. Electronics 106 may include various types of hardware components such as processors (e.g., 107), memory modules, storage devices, communications devices, and/or other types of devices. Any of these hardware components may be operably connected to one another using circuit card traces, cabling, connectors, etc.

Power/thermal components 108 may (i) provide power to any of the components of data processing systems 100 and/or (ii) thermally mange any of the components of data processing systems 100. For example, power/thermal components 108 may include power supplies to provide power to the components. Likewise, power/thermal components 108 may include fans, temperature sensors, management components (e.g., thermal managers), and/or other types of devices usable to regulate the temperatures of the hardware components.

To regulate the temperatures of the hardware components, the fans may be used to generate flows of gases (e.g., air from an ambient environment, gases conditioned by a heating, ventilation/cooling system, etc.). The flows of gases may be used to accelerate dissipation of heat from the hardware components. To do so, some of the flows of gases may pass proximately the hardware components. The flows of gases may displace gases that have been warmed by the hardware components and replace the displaced gases with other gases that may be at a lower temperature, which may increase a rate of dissipation of heat from the hardware components.

To operate, the hardware components may consume electricity and generate heat as a byproduct. Consequently, the heat generated by operation of the hardware components may warm the hardware components.

Any of the hardware components may have limited thermal operating ranges. The thermal operating ranges may include an upper limit and a lower limit. In other words, if the hardware components are too warm or too cold, then the operation of the hardware components may be impacted. For example, if too warm or too cold, the hardware components may not operate, may be subject to errors in their operation, may be subject to damage if operated, and/or may exhibit other undesirable behaviors.

Because of these limited thermal operating ranges and other limitations, the operation (e.g., successful operation) of the hardware components may be dependent on certain conditions of the hardware components being met. These conditions may include, for example, (i) thermal conditions (e.g., retaining temperatures of the hardware components within corresponding thermal operating ranges), (ii) power conditions (e.g., have access to certain levels of electrical power), and/or (iii) other types of conditions.

For example, consider a scenario in which data processing system 100 is located in an environment in which the ambient temperature is outside (e.g., lower than) the thermal operating range of a hardware component. The cool ambient temperature may decrease a temperature of the hardware component outside of its thermal operating range. Doing so may impair the operation of the hardware component which may, in turn, impair the operation of data processing system 100 and the computer implemented services provided by the system.

In general, embodiments disclosed herein relate to systems, methods, and devices for improving the likelihood data processing systems providing computer implemented services using hardware components. To improve the likelihood that data processing system 100 successfully provides the computer implemented services, embodiments disclosed herein may facilitate warming and cooling of hardware components.

Figure 1B:
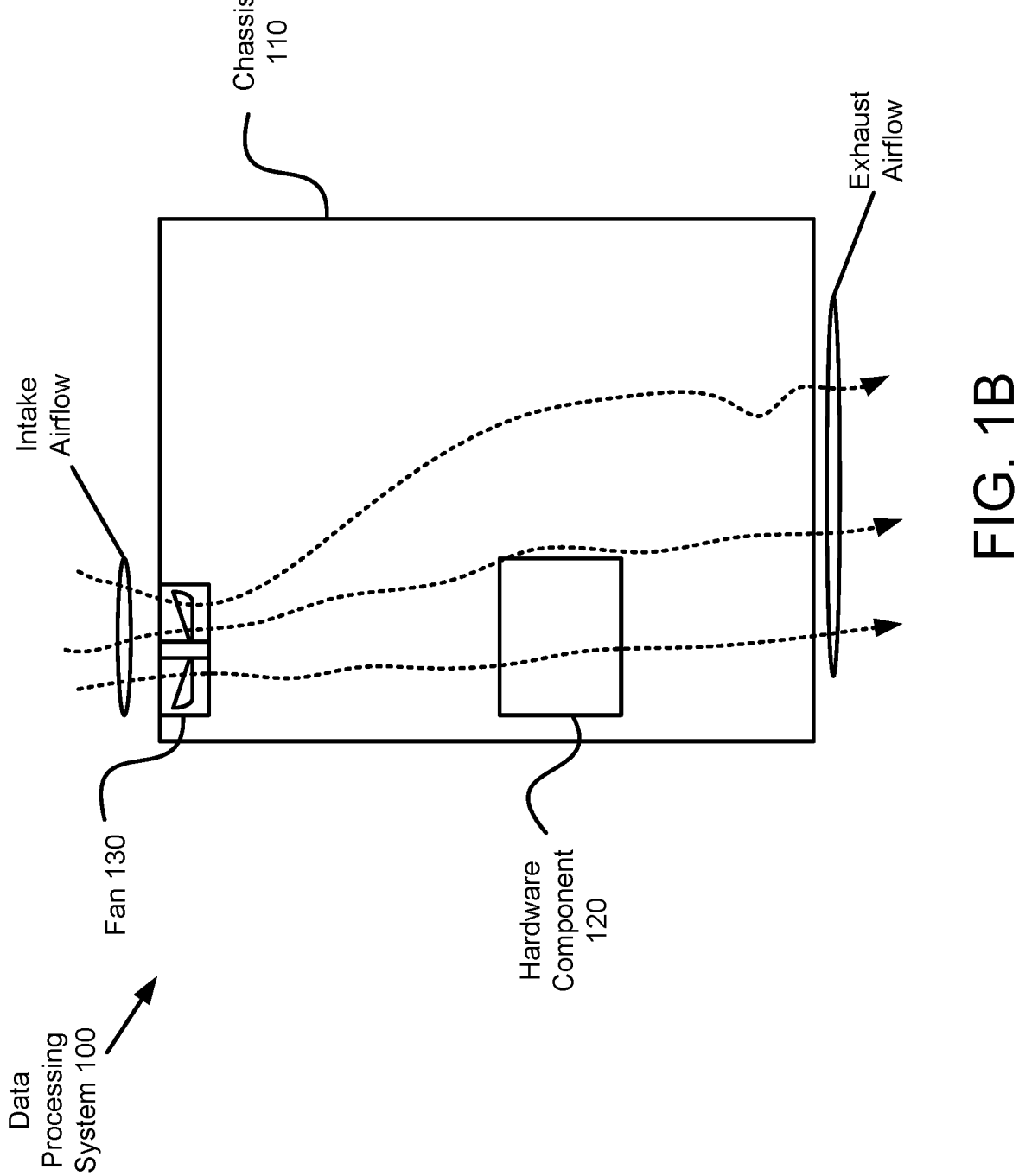
FIG. 1B shows a top view diagram illustrating gas flow in a data processing system in accordance with an embodiment.

To facilitate cooling, data processing system 100 may include fans and temperatures sensors. The temperature sensors may be used to monitor the temperatures of hardware components positioned in chassis 110. The monitored temperatures may be used to set the operation of the fans to dissipate heat thereby retaining the temperatures of the hardware components within corresponding thermal operating limits. Refer to FIG. 1B for additional details regarding flows of gas used to cool hardware components.

To enhance rates of cooling of hardware components, any of the hardware components may be fitted with a heat sink. The heat sink may improve the rate of thermal exchange between the fitted hardware component and nearby gases.

To facilitating warming, data processing system 100 may include heat sinks having integrated heating functionality. For example, one or more of the heat sinks may include a heating assembly. The heating assembly generate heat which may be directed to the fitted hardware component by the other portions of the heat sink. Refer to FIGS. 1C-1J for additional details regarding heat sinks.

By including both warming and cooling capability, a data processing system in accordance with an embodiment may be more likely to provide computer implemented services over a wider range of operating conditions. For example, when positioned in an ambient environment that is sufficiently cold to cool a fitted hardware component below its thermal operating range, the heating assembly of a heat sink positioned with the fitted hardware component may warm the hardware component to keep it within its thermal operating range.

While illustrated in FIG. 1A with a limited number of specific components, a system may include additional, fewer, and/or different components without departing from embodiments disclosed herein.

Turning to FIG. 1B, a top view diagram of data processing system 100 in accordance with an embodiment is shown. In FIG. 1B, only a limited number of components of data processing system 100 are illustrated for conciseness. As noted above, data processing system 100 may generate a flow of gas (e.g., illustrated in FIG. 1B with dashed wavy lines terminating in arrows) that may facilitate cooling of various devices positioned within chassis 110. However, when a temperature of the gas flow is outside the thermal operating ranges of various hardware components (e.g., such as hardware component 120), the operation of hardware component 120 may be impaired if the gas flow reduces the temperatures of hardware component 120 to be outside of its thermal operating range.

To provide its functionality, data processing system 100 may include fan 130 (e.g., a portion of power/thermal Components 108). Fan 130 may selectively (e.g., at different points in time, under the direction of other components) generate the flow of gas. Fan 130 may be implemented with, for example, an electrical motor, fan blades, a housing, etc.

As seen in FIG. 1B, fan 130 may draw in gases (e.g., the intake airflow) through an opening in chassis 110. The gases may traverse through the interior of chassis 110. While traversing, at least a portion of the gases may traverse proximate to hardware component 120. The portion of the gases may undergo thermal exchange thereby modifying the temperatures of hardware component 120. Doing so may warm the portion of the gases. The portion of the gases then be directed out of the interior of chassis 110 (e.g., as an exhaust airflow).

Chassis 110 may house various components of data processing system 100, and may include openings and/or other features for facilitating thermal management. While illustrated in FIG. 1B as having a specific form factor, chassis 110 may be of any form factor (e.g., rack mount, pedestal, etc.) without departing from embodiments disclosed herein.

To thermally manage hardware component 120 and/or other components, hardware component 120 may be fitted with a heat sink. FIGS. 1C-1H illustrate diagrams in accordance with embodiments that show features of heat sinks in accordance with embodiments disclosed herein.

Figure 1C:
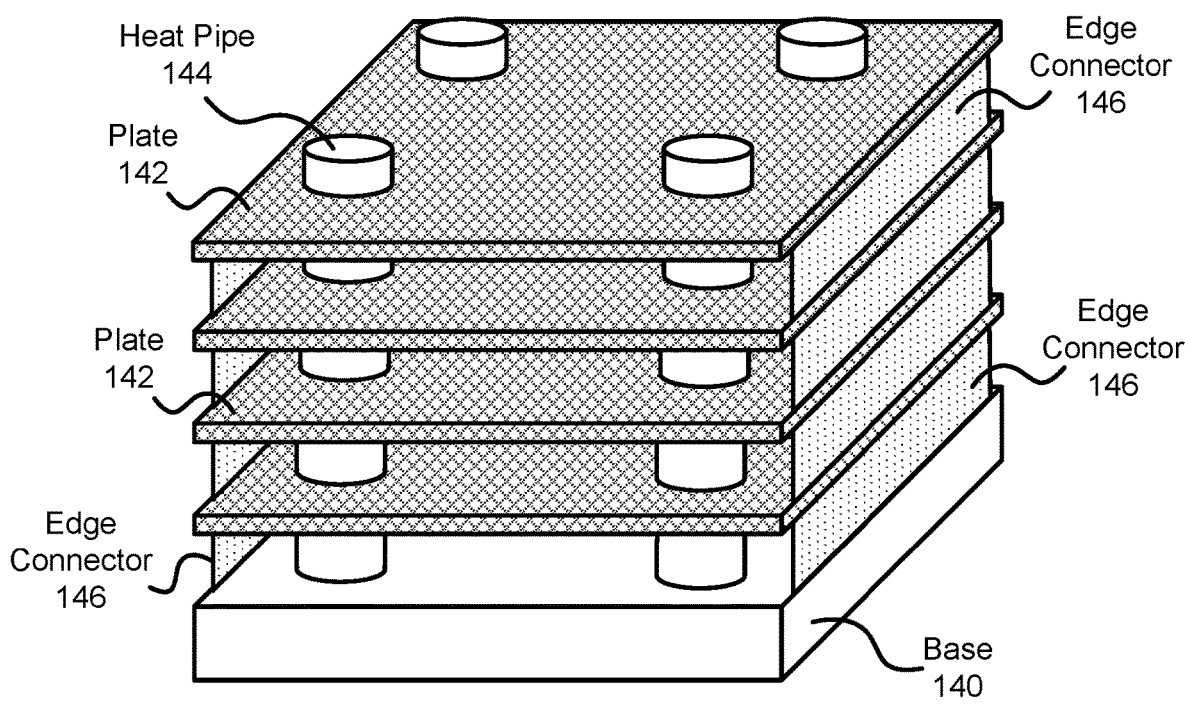
FIGS. 1C-1F show diagrams illustrating a heat sink having a stack of plates parallel to a base in accordance with an embodiment.
Figure 1D:
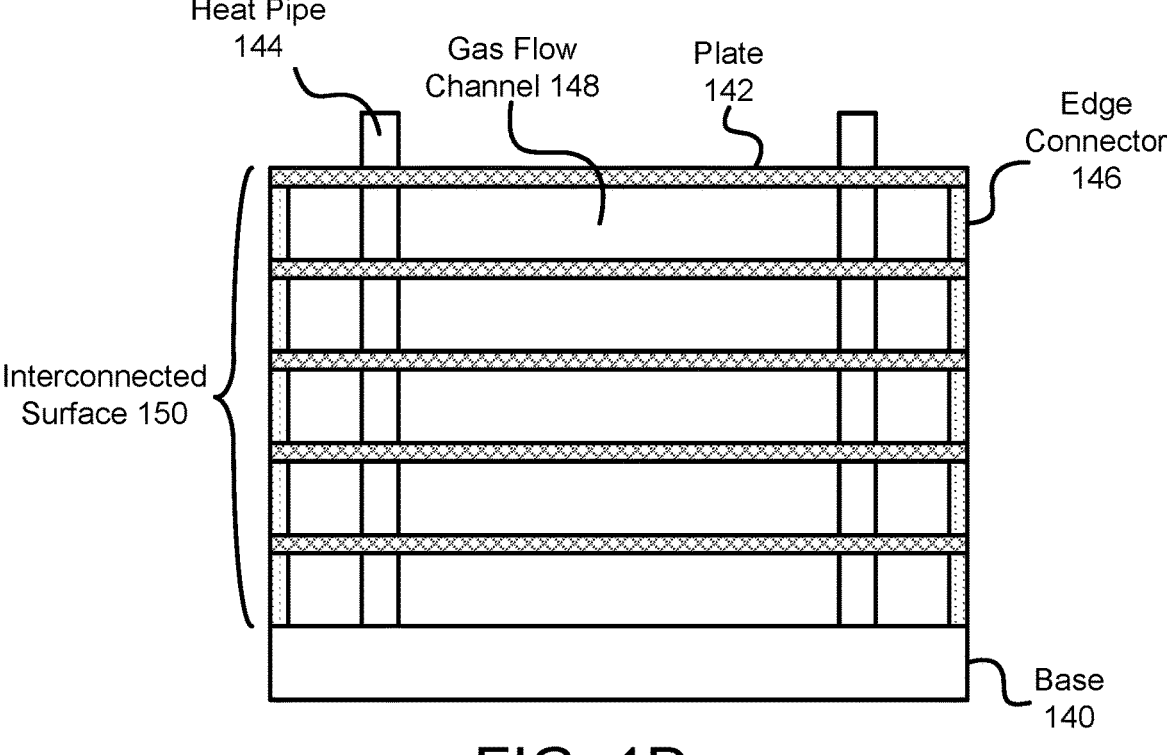
Figure 1E:
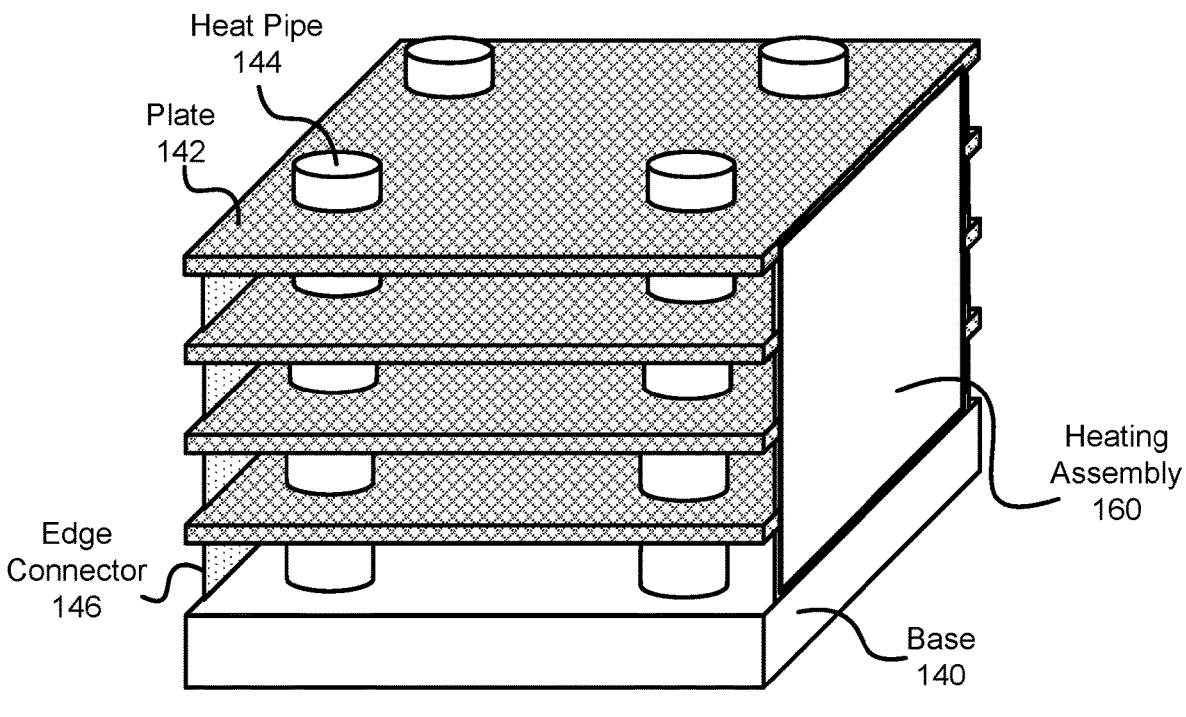
Figure 1F:
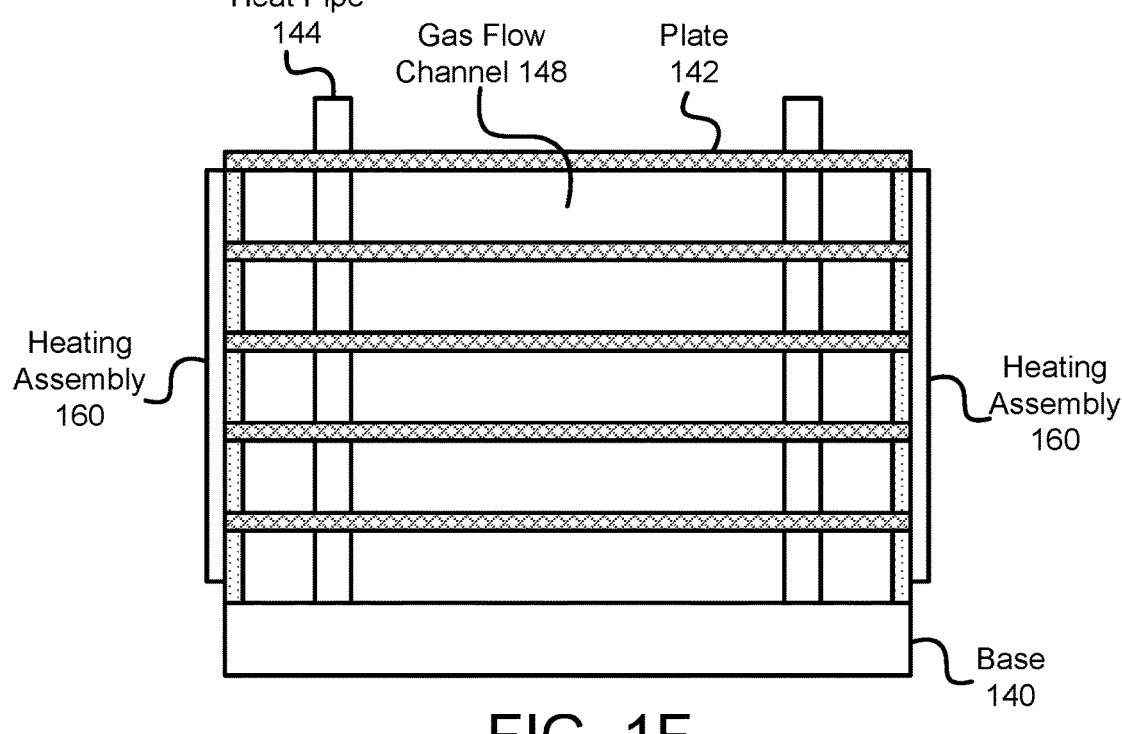

Turning to FIG. 1C, an isometric diagram of a heat sink in accordance with an embodiment is shown. A front view diagram of the heat sink is also shown in FIG. 1D. In FIGS. 1C-1D, a heating assembly is omitted. Refer to FIGS. 1E-1F for additional details regarding the heating assembly.

As noted above, the heat sink may be used to warm and cool a hardware component. To do so, the heat sink may be positioned with the hardware component (e.g., directly on the hardware component, or with a layer of thermal interface material such as a paste). To provide warming and cooling, the heat sink may include base 140, any number of plate 142 (drawn with cross hatch in-fill in FIGS. 1C-1J), any number of heat pipe 144, and any number of edge connector 146 (drawn with dotted in-fill in FIGS. 1C-1J). Each of these component is discussed below.

Base 140 may be implemented with block of material or other structure adapted to be positioned with a hardware component. For example, one side of base 140 may have a shape that facilitates contact with a hardware component. The shape may be, for example, a flat surface. When positioned with a hardware component, the flat surface may facilitate thermal conduction between the hardware component and base 140.

Base 140 may be formed with a thermally conductive material such as aluminum or other metals.

Plate 142 may be implemented with a sheet of material or other structure adapted to exchange heat with gases. For example, plate 142 may be implemented with a sheet of thermally conductive metal. Different plates may have similar or different dimensions (e.g., may be of the same thickness, width, and length, or may be different).

In an embodiment, plates 142 are arranged in a stack. The stack may be above base 140, offset from base 140, and/or may be located in different relative locations with respect to base. Each of the plates may be separated from other plates. Plates that are next to one another may bound a gas flow channel (e.g., 148) between the plates. The gas flow channels between the plates may allow warmed gases between the plates to be displaced by cool gases.

In an embodiment, each of the plates in the stack lay in planes offset from a plane in which base 140 is positioned (e.g., referred to as "a parallel plate stack"), as shown in FIGS. 1C-1F. However, the plates may be oriented with respect to the base differently. For example, as illustrated in FIGS. 1G-1J, the plates may be oriented so that one edge of edge plate connects to base 140 (e.g., referred to as "a perpendicular plate stack").

To facilitate dissipation of heat from a fitted hardware component, in an embodiment, the plates are connected to base 140 via one or more of heat pipe 144. Heat pipe 144 may be a physical structure that facilitates heat transfer between two interfaces via a phase transition. At one end of heat pipe 144 positioned and in contact with base 140, a volatile liquid within heat pipe 144 may transition from a liquid to vapor state (e.g., due to heat from base 140). The vapor may then ascend through the heat pipe to the plates. The plates may be at a lower temperature than base 140, thereby cooling the vapor causing it to condense back into the liquid. The liquid may then return (e.g., via gravity applied force) to the end of the heat pipe 144 in contact with base 140 to repeat the process. In an embodiment, heat pipe 144 includes a wicking material that directs the condensed liquid (e.g., through capillary action) back to the end near base 140.

In an embodiment, heat pipe 144 is implemented with metals such as copper, aluminum, and/or various allows and other materials. The liquid may be implemented with water, a refrigerant (e.g., R134a), ammonia, and/or other volatile liquids.

Heat pipe 144 may place plate 142 in thermal communication with base 140 via thermal conduction (e.g., through the pipe material) and via a two phase loop. Any of the plates may also be in thermal communication (e.g., via thermal conduction) with base 140 via edge connectors, discussed below.

In an embodiment, the plates are only placed in thermal communication with base 140 via thermal condition. For example, as illustrated in FIGS. 1G-1J, a heat sink may not include heat pipes. Rather, a portion of the plates may be in contact with base 140, thereby facilitating thermal transfer between these component.

To facilitate thermal exchange with an ambient environment, as noted above, the plates may be positioned with respect to one another to establish gas flow channels. However, due to the structure of the plates, the plates may be subject to damage that may limit flow of gas through the gas flow channels. For example, the plates may be implemented with sheet metal. However, the sheet metal may be of thin gauge thereby providing for little rigidity of each of the plates.

To improve the structural of the plates, a heat sink may include edge connectors (e.g., 146). The edge connectors may be positioned with pairs of edges of the plates to maintain the distance between each of the edges. For example, the edge connectors may be implemented with sheets of metal that are perpendicular to the plates (e.g., 142) and positioned at edges of two plates. The sheet metal may connect to edges of the two plates, thereby improving the rigidity of the two edges and making it less likely that forces applied to the edges may deform the plates.

Figure 1G:
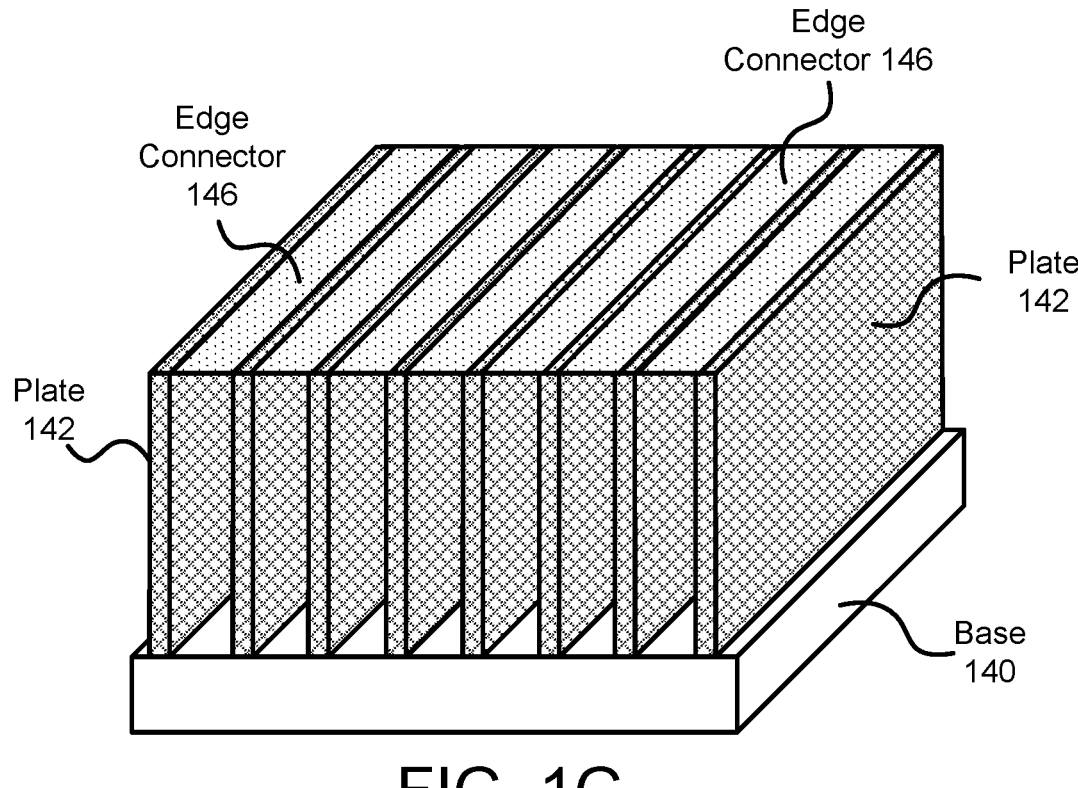
FIGS. 1G-1J show diagrams illustrating a heat sink having a stack of plates perpendicular to a base in accordance with an embodiment.

In an embodiment, each plate and one or two edge connectors are manufactured as a unitary structure. For example, as seen in FIG. 1C, in an embodiment, each plate is supported by two edge connectors (e.g., left and right hand sides in FIG. 1C). In contrast, as seen in FIG. 1G, in an embodiment each plate is supported by one edge connector (e.g., and the base on an opposite side).

For example, in a scenario in which each plate and two edge connectors are implemented as a unitary structure, the unitary structure may be implemented with a piece of sheet metal with two bends to form the edge connectors (e.g., a C-shaped edge connector). In another example, in a scenario in which each plate and a single edge connector are implemented as a unitary structure, the unitary structure may be implemented with a piece of sheet metal with one bend to form the edge connector (e.g., a L-shaped edge connector).

While not shown, edge connector 146 may include features for facilitating attachment to plates and/or other edge connectors. For example, edge connectors 146 may include interlocking features that may allow the edge connectors to be secured to plates and/or other edge connectors.

As seen in FIG. 1D, in an embodiment, the gas flow channels (e.g., 148) are bounded on two sides by two plates (e.g., opposite each other) and by two edge connectors 146 (e.g., opposite each other, perpendicular to the plates) on two sides. Thus, gases may flow through the gas flow channels to facilitate thermal exchange (e.g., a gas flow into or out of the page, as shown in FIG. 1D). However, the gas flow channels may be bounded differently without departing from embodiments disclosed herein. For example, as shown in FIG. H, gas flow channel 148 may be bounded by two plates (e.g., opposite each other), a single edge connector (e.g., perpendicular to the plates), and the base (e.g., opposite the edge connector.

To facilitate selective warming of a hardware component on which a heat sink is positioned, a heating mechanism may be positioned to warm the hardware component. To facilitate conduction of heat to the hardware component, one or more heating mechanisms may be positioned on interconnected surface 150. Interconnected surface 150 may be a surface formed along the edges of the plates (e.g., left hand side and right hand side in FIG. 1D). The surface may include portions of edge connectors and/or plates, depending on whether the edge connectors entirely cover the edges of the plates, or are positioned next to edges so that a portion of the edge of the plate is accessible from interconnected surface 150. In FIG. 1D, the edge connectors are illustrated as exposing the edges of the plates. However, it will be appreciated that the edge connectors may entirely cover the edges of the plates without departing from embodiments disclosed herein.

In contrast to other surface of the heatsink (e.g., such as on top of a top plate of a stack up of the plates), interconnected surface 150 may be in thermal communication with base 140 via several conduction paths (e.g., all of the plates) rather than a more limited number of conduction paths (e.g., just the top plate).

Turning to FIG. 1E, an isometric diagram of a heat sink in accordance with an embodiment is shown. The view may be similar to that shown in FIG. 1C, but now heating assembly 160 may be shown (e.g., positioned on interconnected surface 150). A front view diagram of the heat sink is also shown in FIG. 1F.

Heating assembly 160 may be positioned on all, or a portion, of interconnected surface 150. In FIGS. 1E-1F, heating assembly 160 is illustrated as occupying nearly all of interconnected surface 150, however, heating assembly 160 may be of smaller dimensions (or later) without departing from embodiments disclosed herein. The dimensions of heating assembly 160 may be based on the degree of warming to be provided by the heat sink.

Heating assembly 160 may include a thin film heating element. The thin film heating element may consume electricity and generate heat.

Heating assembly 160 may also include an adhesive layer or other material to adhere the thin film heating element to interconnected surface 150.

Heating assembly 160 may also include a non-conducting layer to electrically isolate the thin film heating element from interconnected surface 150.

Heating assembly 160 may also include a protective layer. The protective layer may protect the other components of heating assembly 160 from the ambient environment. For example, the protective layer may be a polymer sheet positioned above the other components of heating assembly 160 that may be positioned on interconnected surface 150.

Heating assembly 160 may also include a wire harness (e.g., wires, a connector, etc.). The wire harness may facilitate electrical connection of the thin film heating element to a source of electrical power.

As seen in FIG. 1F, heating assembly 160 may be positioned on one or two sides of the plates that are opposite to one another. Depending on the heating needs of a fitted hardware component, the heating assembly 160 may only occupy one side of the heat sink.

Thus, as illustrated in FIGS. 1C-1F, a heat sink in accordance with an embodiment may facilitate both cooling and selective heating of a hardware component. However, while shown in FIGS. 1C-1F with respect to example topologies, heat sinks may have other topologies without departing from embodiments disclosed herein. FIGS. 1G-1J illustrate a heat sink in accordance with embodiments disclosed herein.

Figure 1H:
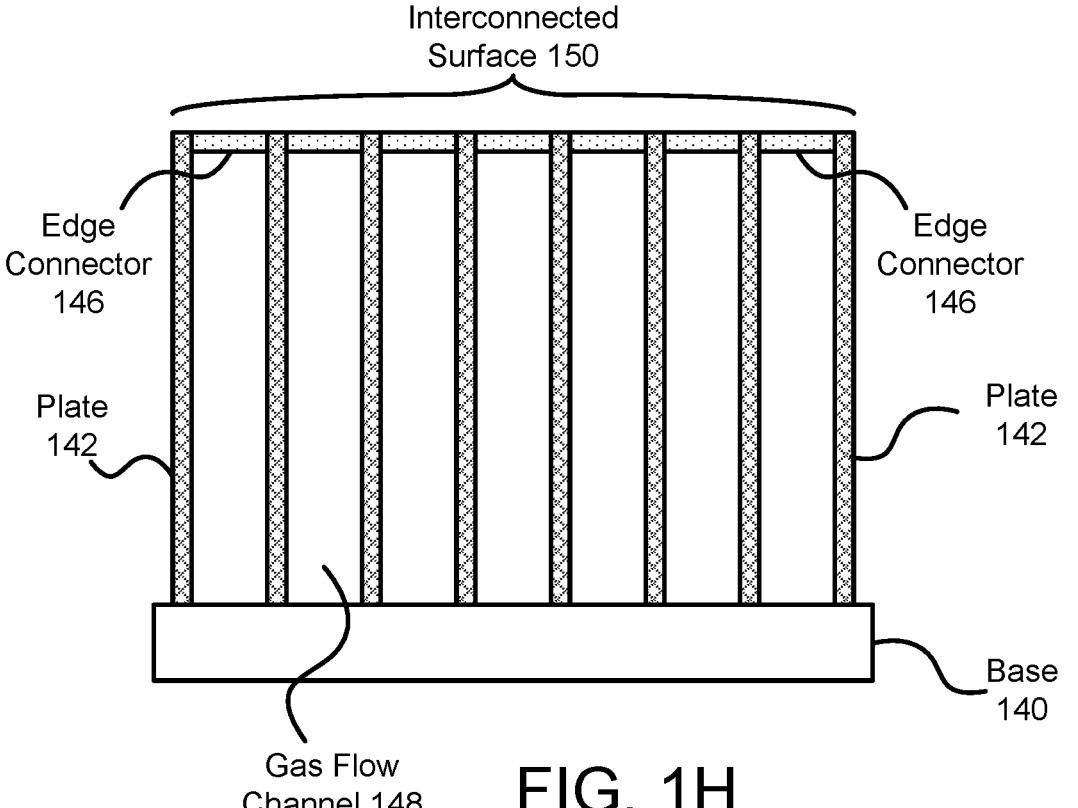

Turning to FIG. 1G, a diagram of a heat sink in accordance with an embodiment is shown. A front view diagram of the heat sink is also shown in FIG. 1H. The heat sink may include plates, edge connectors, and a base, as discussed with respect to FIGS. 1C-1F. However, as seen in FIG. 1G, the heat sink may not include heat pipes and the topology of the plates, edge connectors, and base may be different.

Figures 1I, 1J:
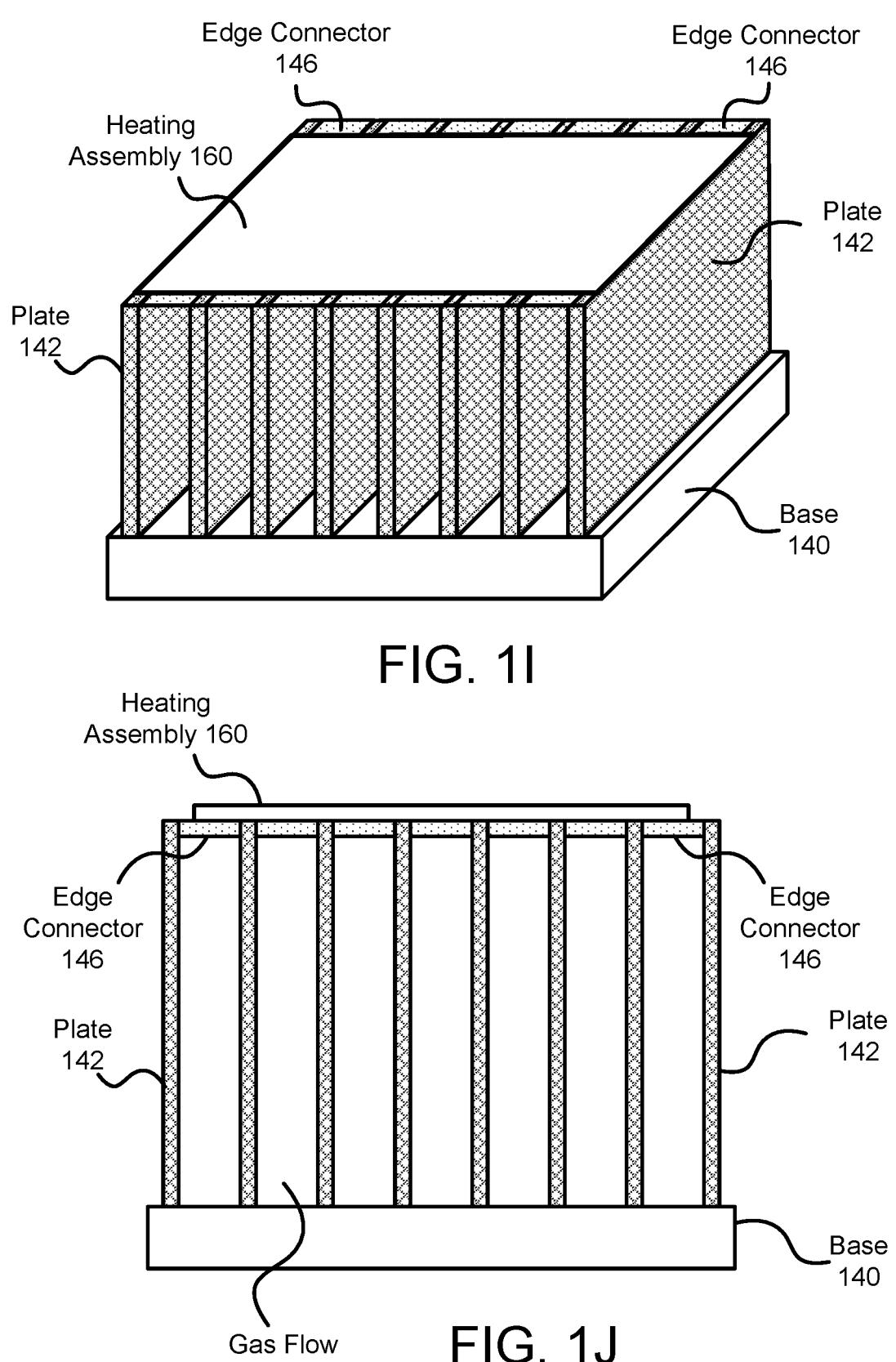

As seen in FIGS. 1G-1H (e.g., the heating assembly omitted for conciseness, refer to FIGS. 1I-1J), plates 142 may be stacked. However, in contrast to being in a stack that is parallel to base 140 as shown in FIGS. 1C-1F, the plates may be stacked perpendicularly to base 140.

Additionally, one edge of each plate may be connected with base 140. Consequently, thermal transport between base 140 and the plates may be through this connection (e.g., thermal conduction).

Likewise, while the edge connectors (e.g., 146) in FIG. 1G may perform a similar function to that performed with respect to the parallel stack of plate, the edges connectors in FIGS. 1G-1J may only retain the positioning of the edge of each of the plates that is opposite of base 140 (e.g., the top edge of the plates shown in FIG. 1G). Consequently, the heat sink shown in FIGS. 1G-1J may only a single interconnected surface 150 as shown in FIG. 1H.

Turning to FIG. 1I, an isometric diagram of a heat sink in accordance with an embodiment is shown. The view may be similar to that shown in FIG. 1G, but now heating assembly 160 is shown (e.g., positioned on interconnected surface 150). A front view diagram of the heat sink is also shown in FIG. 1J.

Heating assembly 160 may be positioned on all, or a portion, of interconnected surface 150. In FIGS. 1I-1J, heating assembly 160 is illustrated as occupying nearly all of interconnected surface 150, however, heating assembly 160 may be of smaller dimensions (or later) without departing from embodiments disclosed herein. The dimensions of heating assembly 160 may be based on the degree of warming to be provided by the heat sink. The components of heating assembly 160 may be similar to those discussed with respect to FIGS. 1E-1F.

When operating heating assembly 160 may generate heat. The heat may be transferred (e.g., through conduction) to base 140 via the plates. The heat may be exchanged with a hardware component with which base 140 is positioned.

As illustrated in FIGS. 1C-1J, a heat sink in accordance with embodiments disclosed herein may include active heating capabilities. The heating capabilities may be used to warm a hardware component so that its temperature does not fall below its operating thermal range.

Figure 2:
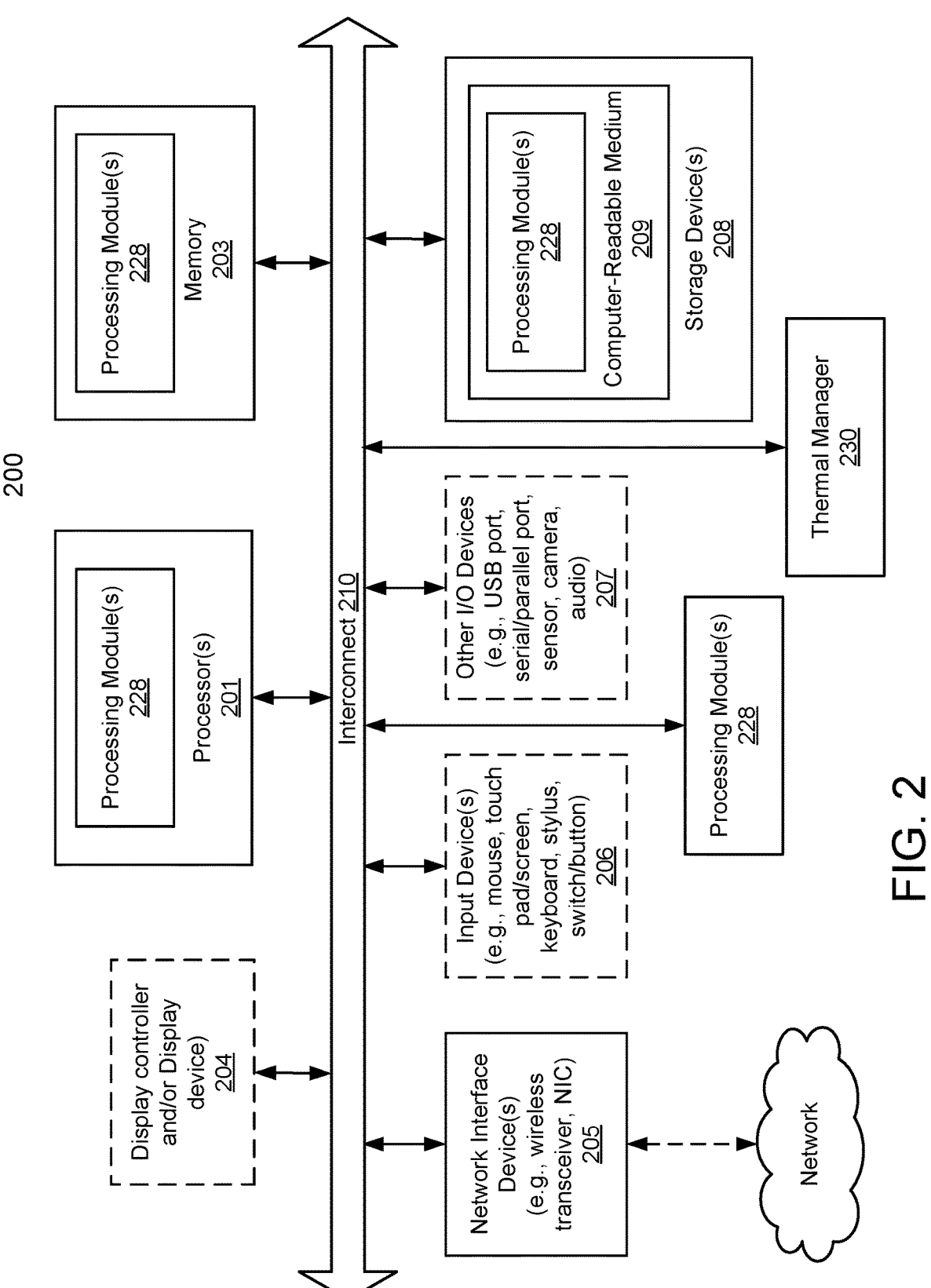
FIG. 2 shows a block diagram illustrating a computing device in accordance with an embodiment.

As discussed with respect to FIG. 1A, data processing system 100 may be implemented with a computing device. For example, a hardware component on which a heat sink may be positioned may be a part of the computing device. Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system.

Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-230 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OV/iOS® from Apple, Android® from Google®, Linux®, Unix®, or other real-time or embedded operating systems such as VxWorks.

System 200 may further include IO devices such as devices (e.g., 205, 206, 207, 208) including network interface device(s) 205, optional input device(s) 206, and other optional 10 device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Thermal manager 230 may manage the temperatures of hardware components (e.g., processor(s) 201). To do so, thermal manager 230 may (i) identify temperatures of the hardware components, (ii) based on the identified temperatures, use fans or other gas flow control components to establish gas flows to cool the hardware components (e.g., to bring them into and/or retain them in thermal operating ranges), (iii) based on the identified temperatures, heating assemblies of heat sinks positioned with the hardware components to warm the hardware components (e.g., to bring them into and/or retain them in thermal operating ranges), and/or (iv) take proactive action (e.g., disable from operating, flag, migrate workloads away from) with respect to hardware components based on their temperatures and thermal operating ranges. Thermal manager 230 may be implemented with a programmable logic device (e.g., a complex logic device, microcontroller, etc.) and/or a static device (e.g., application specific integrated circuit). To provide its functionality, thermal manager 230 may communicate with a host management entity (e.g., an operating system executing with processor(s) 201) to implement various actions and responses based on the temperatures of hardware components (e.g., which may be self-reported and/or measured using temperature sensors).

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system, comprising:
a hardware component;
a fan adapted to generate a flow of gas to cool the hardware component; and
a heatsink positioned with the hardware component, the heatsink comprising:
    a base adapted to establish a thermal condition path with the hardware component;
    plates, in thermal communication with the base, adapted to exchange heat with the flow of the gas to cool the hardware component;
    an edge connector that bridges a gap between a first edge of a first plate of the plate and a second edge of a second plate of the plates, the edge connector defining a portion of an interconnected surface that interconnects a portion of the plates;
    a heating assembly positioned on the interconnected surface and adapted to selectively warm the hardware component substantially through conduction heating via the base, the plates, and the edge connector; and
    a heat pipe that places the base in thermal communication with the plates,
wherein the heat pipe is positioned such that vapor inside the heat pipe ascends from the base to the plates due to heat and liquid inside the heat pipe returns from the plates to the base due to gravity.

2. The data processing system of claim 1,
wherein the plates are arranged in a stack and the plates do not directly contact the base.

3. The data processing system of claim 1, wherein the heatsink further comprises:
edge connectors comprising the edge connector, the edge connectors being positioned to maintain predetermined distances between edges of the plates.

4. The data processing system of claim 3, wherein the edge connectors are positioned to maintain the predetermined distances on two sides of the plates.

5. The data processing system of claim 4, wherein the edge connectors further define a portion of a second interconnected surface that interconnects the portion of the plates, the interconnected surface being on a first of the two sides of the plates and the second interconnected surface being on a second side of the two sides of the plates.

6. The data processing system of claim 5, wherein the heatsink further comprises:
a second heating assembly positioned on the second interconnected surface and adapted to selectively warm the hardware component substantially through conduction heating via the base, the plates, and the edge connector.

7. The data processing system of claim 6, wherein the heatsink further comprises:
gas flow channels through which gases may flow to cool the plates, the gas flow channels being delimited on four sides by the plates and the edge connectors.

8. The data processing system of claim 7, wherein lengths of the gas flow channels are aligned with a direction of the flow of the gas generated by the fan.

9. The data processing system of claim 3, wherein the edge connectors are positioned to maintain the predetermine distances on a first side of the plates.

10. The data processing system of claim 9, wherein a second side of each of the plates is directly connected to the base.

11. A heat sink for a hardware component, comprising:
a base adapted to establish a thermal condition path with the hardware component;
plates, in thermal communication with the base, adapted to exchange heat with gases in an ambient environment;
an edge connector that bridges a gap between a first edge of a first plate of the plate and a second edge of a second plate of the plates, the edge connector defining a portion of an interconnected surface that interconnects a portion of the plates; and
a heating assembly positioned on the interconnected surface and adapted to selectively warm the hardware component substantially through conduction heating via the base, the plates, and the edge connector; and a heat pipe that places the base in thermal communication with the plates, wherein the heat pipe is positioned such that vapor inside the heat pipe ascends from the base to the plates due to heat and liquid inside the heat pipe returns from the plates to the base due to gravity.

12. The heat sink of claim 11, wherein the plates are arranged in a stack and the plates do not directly contact the base.

13. The heat sink of claim 11, further comprising:

edge connectors comprising the edge connector, the edge connectors being positioned to maintain predetermined distances between edges of the plates.

14. The heat sink of claim 13, wherein the edge connectors are positioned to maintain the predetermine distances on two sides of the plates.

15. The heat sink of claim 14, wherein the edge connectors further define a portion of a second interconnected surface that interconnects the portion of the plates, the interconnected surface being on a first of the two sides of the plates and the second interconnected surface being on a second side of the two sides of the plates.

16. The heat sink of claim 15, further comprising:

a second heating assembly positioned on the second interconnected surface and adapted to selectively warm the hardware component substantially through conduction heating via the base, the plates, and the edge connector.

17. The heat sink of claim 16, further comprising:

gas flow channels through which gases may flow to cool the plates, the gas flow channels being delimited on four sides by the plates and the edge connectors.

18. The heat sink of claim 13, wherein the edge connectors are positioned to maintain the predetermine distances on a first side of the plates.

19. The heat sink of claim 18, wherein a second side of each of the plates is directly connected to the base.

20. The heat sink of claim 19, further comprising:

gas flow channels through which gases may flow to cool the plates, the gas flow channels being delimited on four sides by the plates, the edge connectors, and the base.

* * * * *